(12) United States Patent
Van Zon

(10) Patent No.: US 6,756,782 B2
(45) Date of Patent: Jun. 29, 2004

(54) MAGNETIC FIELD MEASURING SENSOR HAVING A SHUNT RESISTOR AND METHOD OF REGULATING THE SENSOR

(75) Inventor: Joannes Baptist Adrianus Dionisius Van Zon, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/118,878

(22) Filed: Apr. 9, 2002

(65) Prior Publication Data

US 2003/0107373 A1 Jun. 12, 2003

(30) Foreign Application Priority Data

Jun. 1, 2001 (EP) ............................................. 01202135
Jun. 1, 2001 (EP) ............................................. 01202136

(51) Int. Cl.[7] ............................................. G01R 33/02
(52) U.S. Cl. ............. 324/252; 324/207.12; 324/207.21; 338/32 R
(58) Field of Search ................................. 324/252, 224, 324/117 H, 117 R, 251, 207.2, 207.21, 207.12, 260, 249; 338/32 H, 32 R

(56) References Cited

U.S. PATENT DOCUMENTS 5,247,278 A * 9/1993 Pant et al. ................. 338/32 R
5,483,162 A * 1/1996 Ushikoshi et al. ........... 324/252
5,831,426 A * 11/1998 Black et al. ................. 324/127
5,952,825 A * 9/1999 Wan ............................ 324/252

FOREIGN PATENT DOCUMENTS

DE 254466 A1 2/1988

* cited by examiner

*Primary Examiner*—N. Le
*Assistant Examiner*—Subhash Zaveri
(74) *Attorney, Agent, or Firm*—Aaron Waxler

(57) ABSTRACT

A sensor for measuring a magnetic field includes a substrate, four magnetic elements arranged in a bridge configuration on the substrate, a first bridge portion. A first element and a second element are connected in series, a second bridge portion, and a third element and a fourth element are connected in series, being situated between a first contact and a second contact. The first bridge portion includes an electrical shunt resistor, which is arranged parallel to the first magnetic element of the bridge. In order to compensate for offset voltage and offset voltage drift in the output voltage of the bridge configuration, the temperature coefficient of the shunt resistor compensates for the variation of the temperature coefficients of the magnetic elements in the bridge.

15 Claims, 5 Drawing Sheets

MAGNETIC FIELD MEASURING SENSOR HAVING A SHUNT RESISTOR AND METHOD OF REGULATING THE SENSOR

The invention relates to a sensor for measuring a magnetic field, comprising a substrate, a first magnetic element, a second magnetic element, a third magnetic element and a fourth magnetic element on the substrate in a bridge configuration, a first bridge portion wherein the first element and the second element are arranged in series and a second bridge portion wherein the third element and the fourth element are arranged in series being situated between a first contact and a second contact.

The invention also relates to a method of regulating a sensor for measuring a magnetic field, wherein a first magnetic element, a second magnetic element, a third magnetic element and a fourth magnetic element are situated on a substrate in a bridge configuration, a first bridge portion wherein the first element and the second element are arranged in series, and a second bridge portion wherein the third element and the fourth element are arranged in series being situated between a first contact and a second contact, and a first output contact being situated between the first element and the second element, and a second output contact being situated between the third element and the fourth element, a voltage being applied between the first contact and the second contact.

EP 0710850 shows a sensor for measuring a magnetic field. Magnetic sensors are used, inter alia, for reading data in a head for a hard disk or tape, or in the automobile industry for measuring angles and rotational speeds and to determine the position. Magnetic sensors have the advantage that they are comparatively insensitive to dust and enable measuring to take place in a contact-free manner. Sensors used for automotive applications must be resistant to high temperatures of approximately 200° C.

In the known sensor, the resistance of the magnetic elements depends on the size and orientation of the magnetic field due to a magnetoresistance effect. The magnetic elements are arranged in a Wheatstone bridge configuration. The magnetic elements are spin valves. The spin valves comprise a pinned layer with a fixed orientation of the axis of magnetization and a layer with a free orientation of the axis of magnetization, which adopts the orientation of the magnetic field to be measured. The magnetoresistance value is determined, inter alia, by the angle between the axis of magnetization of the pinned layer and the freely rotatable axis of magnetization. In the Wheatstone bridge the axes of magnetization of the pinned layers in the bridge portions are oppositely directed. The difference in output voltage between the two bridge portions is converted to a differential amplitude voltage signal, which is a measure of the angle and the strength of the magnetic field. By virtue of said Wheatstone bridge configuration, the sensor is less sensitive to temperature than in the case of a single magnetoresistance element. The known sensor has become sensitive, however, to offset voltage and drift in offset voltage.

The offset voltage is defined as the output voltage of the bridge configuration in the absence of a magnetic field, and arises from differences in resistance values between the elements of the bridge. As a result of the fact that, in the known sensor, some magnetic elements of the bridge are locally heated in order to orient the axis of magnetization of the pinned layers, while others are not locally heated, differences in resistance values occur between the magnetoresistance elements.

The differences in resistance in the case of local heating are caused by interfacial mixing of the multilayers, as a result of which the magnetoresistance effect is reduced.

A drawback of the known sensor is that it cannot suitably be used to accurately measure magnetic fields in a large temperature range. The output voltage of the bridge circuit has an offset voltage at comparatively small magnetic fields. In addition, the known sensor is sensitive to fluctuations in temperature, as a result of which, inter alia, the offset voltage changes as a function of temperature, the so-termed drift in offset voltage.

It is an object of the invention to provide a sensor of the type described in the opening paragraph, which sensor can suitably be used to accurately measure magnetic fields in a large temperature range.

As regards the sensor in accordance with the invention, this object is achieved in that the first bridge portion includes an electric shunt resistor, which has a temperature coefficient and is electrically connected in parallel with the first magnetic element of the bridge.

The invention is based on the recognition that the offset voltage and the drift in the offset voltage are influenced predominantly by different parameters.

The electric resistance of a magnetoresistance element of the bridge corresponds approximately to $R=R_0(1+\alpha T)$, where $R_0$ indicates the resistance at a temperature $T=0°$ C. and $\alpha$ is the temperature coefficient.

As the offset voltage is caused predominantly by a spread of the resistance values and drift in the offset voltage is caused predominantly by a spread of the temperature coefficients of the resistors, it is possible to separately compensate for the offset voltage and the drift in the offset voltage.

The drift in the offset voltage of the bridge configuration is compensated for in that the first bridge portion includes an electric shunt resistor that has a temperature coefficient and is electrically connected in parallel with first magnetic element of the bridge. If the overall resistance of the bridge changes as a result of a change in temperature, the shunt resistance changes also as a function of temperature, preferably in the opposite direction. The reduced drift in the offset voltage enables magnetic fields to be measured more accurately, particularly if fluctuations in temperature occur during operation.

Due to the compensating effect of the shunt resistor, the temperature coefficient of the shunt resistor preferably is of opposite sign to the temperature coefficient of the electric resistor of the first magnetic element. A large number of materials has a constant temperature coefficient over a large temperature range. Once the composition of the materials used for the magnetic elements is fixed, a material can be chosen for the shunt resistor having a temperature coefficient of opposite sign. The material of the shunt resistor is preferably provided in a separate deposition process. Subsequently, the material is structured by means of standard lithography and etching.

Advantageously, the absolute value of the temperature coefficient of the shunt resistor is larger than the absolute value of the temperature coefficient of the electric resistor of the first magnetic element. If so, the shunt resistor can suitably be used to compensate for comparatively large differences in drift of the offset voltage.

The shunt resistor may comprise at least one layer of a material, but it may alternatively comprise a plurality of layers such as, for example, in the case of a multilayer structure. To obtain a very accurate correction by means of the shunt resistor, the combination of a plurality of temperature coefficients of different layers of the shunt resistor can result in a better correction in a large temperature range.

Preferably, the shunt resistance is larger than the resistance value of the first magnetic element. As the shunt resistor is parallel-connected to the first magnetic element, a part of the current passes through the shunt resistor, so that the net magnetoresistance effect of the parallel connection is reduced. Favorably, the shunt resistance is chosen to be much larger than the resistance value of the magnetic element, for example a factor of 100. In this case, a reduction of the magnetoresistance effect by only maximally 1% takes place.

Advantageously, a first shunt resistor is arranged parallel to the first magnetic element and a second shunt resistor is arranged parallel to an element of the second bridge portion so as to reduce the drift in offset voltage in both bridge portions. It has been found that the drift in offset voltage is largest if the first element of the first bridge portion exhibits spread near the first contact, and the element of the second bridge portion exhibits spread near the second contact. As a second shunt resistor is situated, parallel to the element of the second bridge portion, near the first contact, positive as well as negative offset voltage drift can be compensated for.

Each magnetic element may comprise a number of paths of magnetic material which are mutually connected in series by electric conductors of, for example, a metal.

Advantageously, the resistance values of the electric conductors of each magnetic element are substantially the same to preclude that differences between resistance values of the bridge arise as a result of the electric conductors.

Although the resistivity of the electric conductors, such as Al or Cu, is generally much smaller than that of the material of the magnetic elements, the metal advantageously has a temperature coefficient that corresponds to the temperature coefficient of the magnetic material of the first magnetic element.

As the first bridge portion includes an electric trimmer resistor, which is connected in series with the first magnetic element and the shunt resistor, the offset voltage of the bridge is reduced. The trimmer resistor may comprise a circuit of resistors that are situated outside the bridge configuration. The resistors are preferably made of the same material as the magnetic elements. By means of a laser the resistors can be switched on or off. The trimmer resistor is regulated such that the offset voltage is substantially equal to zero.

Another object of the invention is to provide a method of manufacturing the sensor of the type described in the opening paragraph, by means of which the offset voltage and drift in the offset voltage can be regulated so as to become zero.

The object of the invention as regards the method is achieved, according to the invention, in that in the absence of a magnetic field, an output voltage between the first output contact and the second output contact of the bridge is reduced by means of a shunt resistor which is electrically connected in parallel with the first magnetic element in the first bridge portion.

The output voltage is preferably reduced at a temperature above room temperature. The differences in resistance values between the magnetic elements resulting from differences in temperature coefficient are generally larger at an increased temperature. The sensor can be regulated throughout the temperature range to which the sensor is exposed during operation.

Preferably, the shunt resistance can be adjusted. A suitable choice of materials enables the resistance value of the shunt resistor and the temperature coefficient to be accurately adjusted. The resistivity of the material, the thickness of the material and the geometry determine to a substantial degree the resistance value of the shunt resistor. The shunt resistor may comprise a circuit of a plurality of resistors.

Fine setting of the shunt resistance can be carried out by switching on or off several resistors of the circuit of the shunt resistor, using for example a laser.

After the drift in offset voltage has been reduced as much as possible by means of the shunt resistor, the output voltage of the bridge is reduced by means of an electrically adjustable trimmer resistor, which is electrically connected in series with the first magnetic element. The trimmer resistor is preferably also electrically connected in series with the shunt resistor. The offset voltage of the bridge is reduced at room temperature, said offset voltage being reduced substantially to zero.

These and other aspects of the sensor in accordance with the invention will be apparent from and elucidated with reference to the embodiment(s) described hereinafter.

In the drawings:

FIG. 1 diagrammatically shows the sensor in accordance with the invention;

FIG. 3 shows an output characteristic of the sensor in accordance with the first embodiment;

FIG. 4 shows a method of regulating the offset voltage drift and offset voltage in accordance with the invention.

Figure 1:
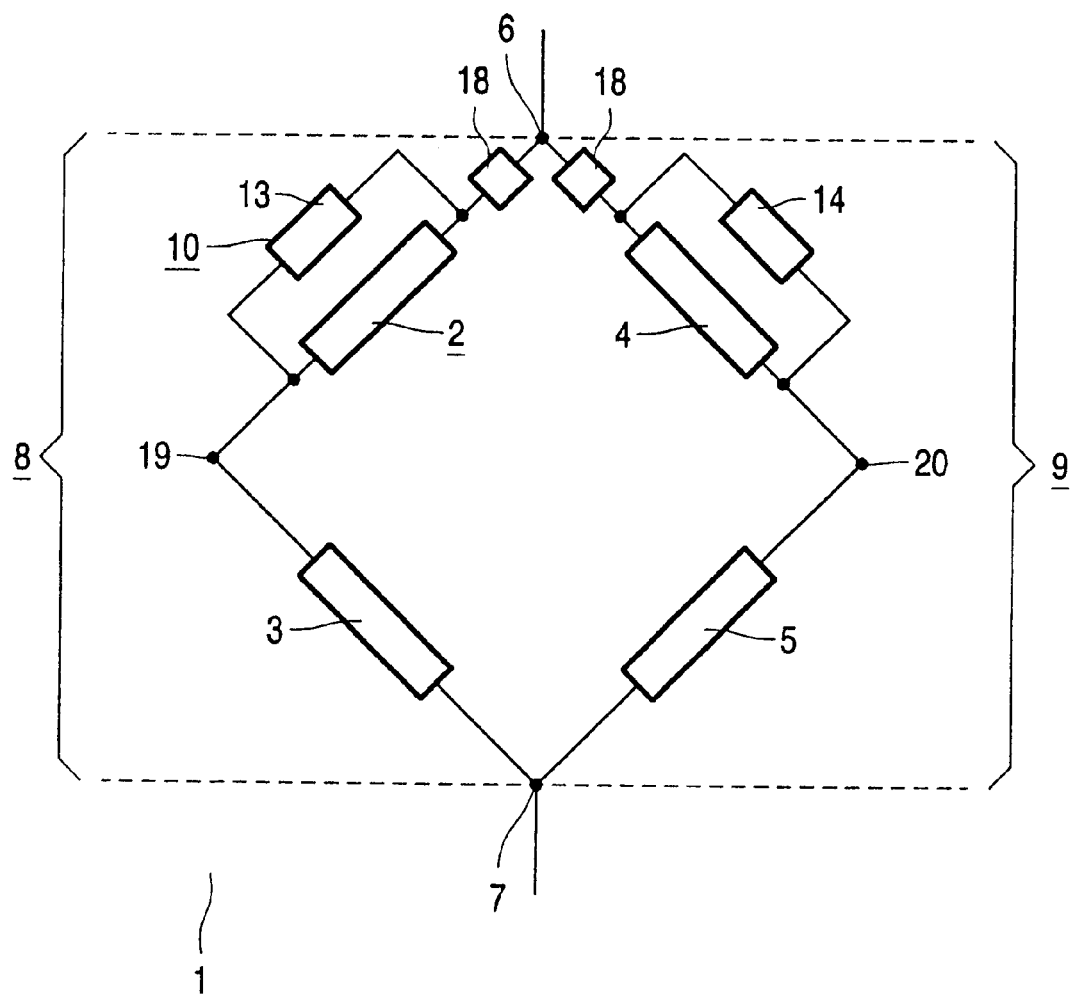

The sensor shown in FIG. 1 comprises a substrate 1, a first magnetic element 2, a second magnetic element 3, a third magnetic element 4 and a fourth magnetic element 5 situated on the substrate 1 in a Wheatstone bridge configuration, a first bridge portion 8, wherein the first element 2 and the second element 3 are arranged in series, and a second bridge portion 9, wherein the third element 4 and the fourth element 5 are arranged in series, being situated between a first contact 6 and a second contact 7. The magnetic elements have an AMR, GMR or TMR effect.

The first bridge portion 8 includes an electric shunt resistor 10, which has a temperature coefficient and is arranged parallel to the first magnetic element 2 of the bridge.

The magnetic elements 2, 3, 4, 5 are composed of layers that are provided, for example, by sputtering. It is important that all layers are provided during one deposition operation in order to obtain clean interfaces as well as a high purity and uniformity among the magnetic elements. The magnetoresistance effect and the temperature coefficient should be substantially the same for all elements.

For a magnetic element based on the AMR effect, for example, NiFe having a temperature coefficient of 1960 ppm/K is used for the magnetic layer.

The magnetic elements of the sensor may alternatively be spin valves or magnetic tunnel junctions. A spin valve structure based on the GMR effect can be manufactured as follows. A substrate 1 is provided with a multilayer structure comprising, in succession, a buffer layer of, for example, 3.5 nm Ta/2.0 nm Py to induce the proper material structure, such as in this case the (111) texture, a magnetic layer having an axis of magnetization as the pinned layer, comprising an exchange biasing layer of 10 nm $Ir_{19}Mn_{81}$ and an artificial anti-ferromagnet of 3.5 nm $Co_{90}Fe_{10}$/0.8 nm Ru/3.0 mm $Co_{90}Fe_{10}$, a non-magnetic spacer layer of 3 nm Cu, and a ferromagnetic layer of 5.0 nm Py: the free layer (below which extends, for example, a thin layer of 1.0 nm $Co_{90}Fe_{10}$ which enhances the GMR effect and limits interlayer diffusion, resulting in an increased thermal stability). For the protection layer use is made of 10 nm Ta which is applied to the multilayer.

The temperature coefficient of the individual layers is substantially constant as a function of temperature, with the exception of the temperature coefficient of IrMn, which has a substantially constant value of −3000 ppm/K in the temperature range from 20 to 80° C., but is much less negative at higher temperatures. The temperature coefficient of the total layer packet is approximately 1200–1400 ppm/K at a temperature of 20° C. Spread in the deposition process leads to differences in resistance and temperature coefficient between the various magnetic elements. A typical value of the spread in resistance is 1% and a typical value of the spread in temperature coefficient is also approximately 1%.

In this embodiment, the resistance of a magnetic element is chosen to be, for example, R=4100 Ohm and the temperature coefficient is chosen to be 1400 ppm/K. In the bridge configuration shown in FIG. 1, the magnetic elements have a resistance $R+\Delta R$ and a temperature coefficient $\alpha+\Delta\alpha$. A variation of 1% in resistance ($\Delta R=0.101R$) and 1% in temperature coefficient ($\Delta\alpha=0.01\alpha$) already leads to large offset voltages of several tens of mV and an offset voltage drift of tens of $\mu V/K$.

In the embodiment shown, the variation of the offset voltage $\Delta V_{offset}$ resulting from a variation of the resistances $\Delta R$ at an applied voltage of $V_0$ is approximately:

$$\Delta V_{offset}/V_0 = (\frac{1}{2}R)^* \Delta R \qquad (1)$$

At a temperature T, the variation of the offset voltage as a result of the variation in temperature coefficient is approximately:

$$\Delta V_{offset}/V_0 = (T/2(1+\alpha T)^* \Delta\alpha, \qquad (2)$$

By means of formula (1) and an applied voltage $V_0=1V$, the variation of the offset voltage amounts to approximately 5 mV for the values of the example (R=4100 Ω, ΔR=41 Ω, α=1400 ppm/K, Δα=14 ppm/K), and the variation of the offset voltage as a result of the variation in temperature coefficient is 0.14 mV. Thus, the offset voltage can be largely attributed to differences in resistance values. Differences in resistance value cannot only be attributed to spread of layers but also to differences between the dimensions of structures caused by spread in lithography and etching.

As a result of spread in resistance value $\Delta R$ and temperature coefficient $\Delta\alpha$, the variation of the drift offset voltage $\Delta V_{drift}$ is as follows:

$$(\Delta V_{drift}/\Delta T)/V_0 = (2(\Delta\alpha)^2 T/R(2+2\alpha T)^{3})^* \Delta R \qquad (3)$$

$$(\Delta V_{drift}/\Delta T)/V_0 = (\frac{1}{2}(1+\alpha T)^{2})^* \Delta\alpha \qquad (4)$$

By means of formulas (3) and (4) it can be derived that the drift in offset voltage is caused by, respectively, a spread in the resistance value of $9*10^{-6}$ $\mu V/K$ and by a spread in the temperature coefficient of 6.6 $\mu V/K$ for the values mentioned in the example. The drift in offset voltage can be attributed mainly to differences in temperature coefficient between the resistors of the magnetic elements in the bridge configuration.

The first bridge portion 8 includes a shunt resistor 10 which is electrically parallel-connected to the first magnetic element 2 and is made of a layer of a suitable material, for example Ta having a temperature coefficient of −510 ppm/K. By choosing the temperature coefficient of the shunt resistor to be of opposite sign to the temperature coefficient of the electric resistor of the first magnetic element 2, the drift in the offset voltage can be readily compensated for. In order to sufficiently compensate for a comparatively large degree of spread between the temperature coefficients of the magnetic elements, the shunt resistor may be manufactured from a material having a high negative temperature, such as IrMn with α=−3000 ppm/K.

If the temperature coefficient of the first magnetic element 2 is not constant as a function of temperature, it is desirable, in order to obtain a satisfactory compensation of the drift in the offset voltage of the bridge configuration, to use a multilayer structure also for the shunt resistor 10, which multilayer structure has a temperature coefficient that is opposite in sense as a function of temperature.

Figure 2:
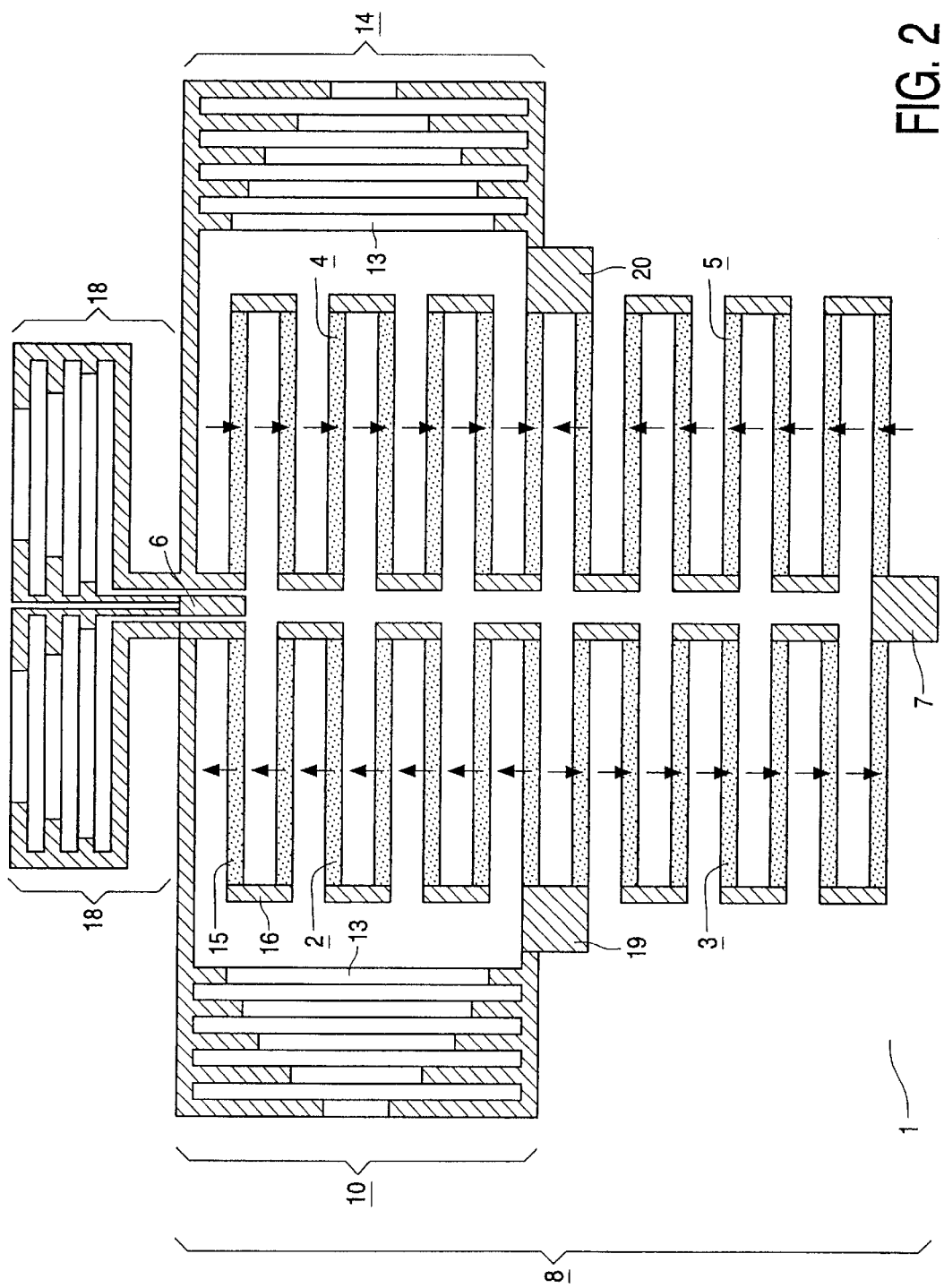
FIG. 2 is a plan view of a first embodiment of the sensor in accordance with the invention.

In the embodiment shown in FIG. 2, each magnetic element 2, 3, 4, 5 comprises a number of paths 16 of a magnetic material. The resistance of a path is $R=\rho/d \; L/W$, where $\rho$ indicates the resistivity of the material, d indicates the thickness of the layer, L indicates the length and W indicates the width of the path. The shunt resistor may be a single strip, but in the embodiment shown, the shunt resistor 10 is an electric circuit of strips connected in parallel. The shunt resistance can be regulated by burning through the connections of the strip-shaped resistors by means of a laser, as a result of which said strip-shaped resistors are switched on or off.

The shunt resistance 10 is much higher than the resistance of the first magnetic element 2, for example 300 kOhm to 1 MOhm. As a result, the resistance of 4100 Ohm changes only by 1% (41 Ohm) relative to the overall resistance of 4100 Ohm. The shunt resistor is made of a layer of Ta having a temperature coefficient of −510 ppm/K.

Spread of the layers has the greatest effect on the offset voltage and drift in the offset voltage if the largest differences occur between the diagonal elements of the Wheatstone bridge. In the embodiment shown in FIG. 2, a second shunt resistor 14 is electrically parallel-connected with the element 5 near the first contact 6 of the second bridge portion 9. The temperature coefficient of the total resistor varies by approximately 1.8%. This is amply sufficient to compensate for the 1% variation of the temperature coefficient of the total resistor.

In the embodiment shown in FIG. 2, each magnetic element 2, 3, 4, 5 comprises a number of paths 15 of a magnetic material which are mutually connected in series by electric conductors of a metal. For the metal use is made of, for example, Al or Cu, which is patterned by means of a mask and physical or chemical etching.

In the embodiment shown, the resistance of the electric conductors 16 of each magnetic element 2, 3, 4, 5 is substantially equal.

The symmetrical layout ensures that a substantially identical surface of the electric conductors 16 of the elements is obtained.

The metal, for example Cu, has a temperature coefficient of 1070 ppm/K, which corresponds substantially to the temperature coefficient of the magnetic material 15 of the first magnetic element 2, which ranges from 1200 to 1400 ppm/K.

The first bridge portion 8 comprises a trimmer resistor 18 which is connected in series with the first magnetic element 2 and the shunt resistor 10.

The composition of the material of the trimmer resistor is the same as that of the material of the magnetic elements. The trimmer resistor comprises a circuit of resistors that can be switched on or off by means of a laser.

FIG. 3 shows the output voltage of a GMR Wheatstone bridge in accordance with the first embodiment, as shown in FIG. 2, in the temperature range from 20 to 200° C. at an input voltage across the contacts of 5 V.

Figure 3A:
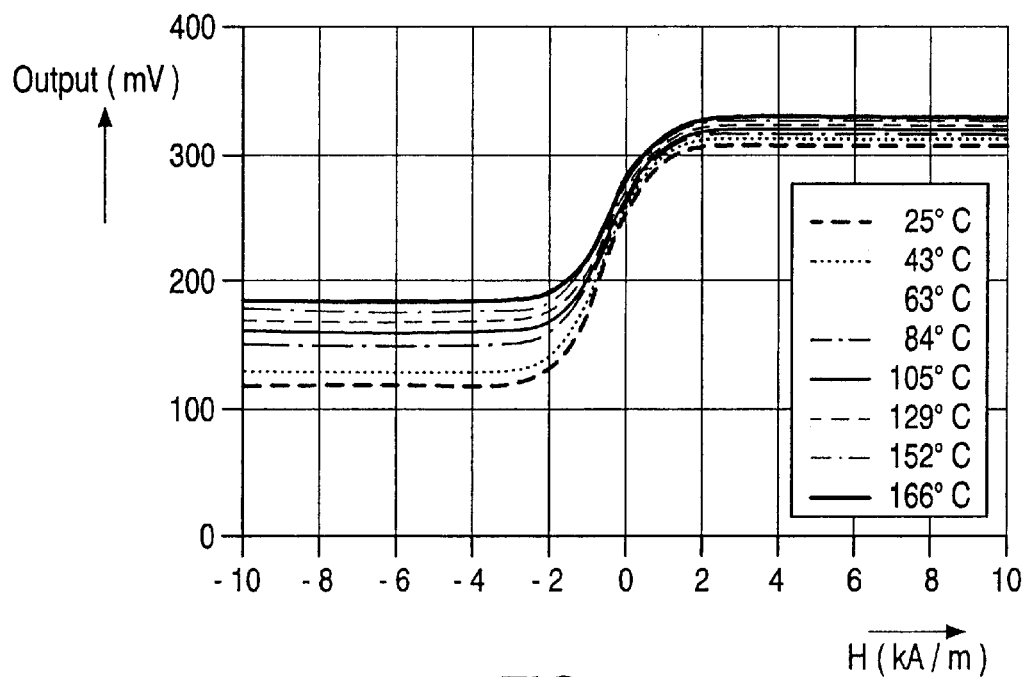
FIG. 3a shows the sensor without a shunt resistor and trimmer resistor.
Figure 3B:
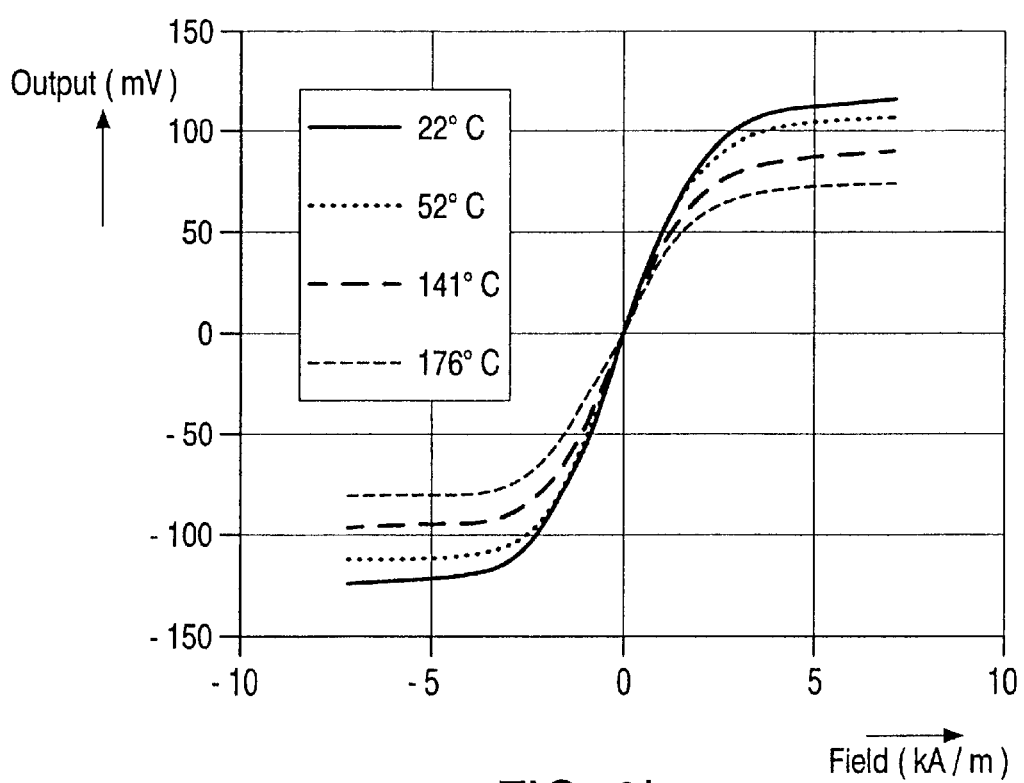
FIG. 3b shows the sensor in accordance with the invention with a shunt resistor and trimmer resistor.

In FIG. 3a, the output characteristic of the sensor without a shunt resistor or trimmer resistor is shown by way of reference. The output voltage as a function of the magnetic field to be measured is highly asymmetrical around the magnetic field H=0 kA/m. The drift of the offset voltage increases clearly as the temperature T increases. The GMR Wheatstone bridge in accordance with the first embodiment has an output voltage as shown in FIG. 3b. As a function of the magnetic field to be measured, the output voltage is very linear around H=0 kA/m. If the temperature increases in the temperature range from 22 to 176° C., the drift in offset voltage is not visible in the output voltage. The GMR effect is 6%, hysteresis is low and the offset voltage drift is reduced from 6.6 $\mu$V/K (in FIG. 3a) to 0.7 $\mu$V/K.

In an advantageous method of regulating a sensor for measuring a magnetic field, a voltage is applied between the first contact 6 and the second contact 7, and, in the absence of a magnetic field, an output voltage is measured between the first output contact 19 and the second output contact 20 of the bridge.

Figure 4A:
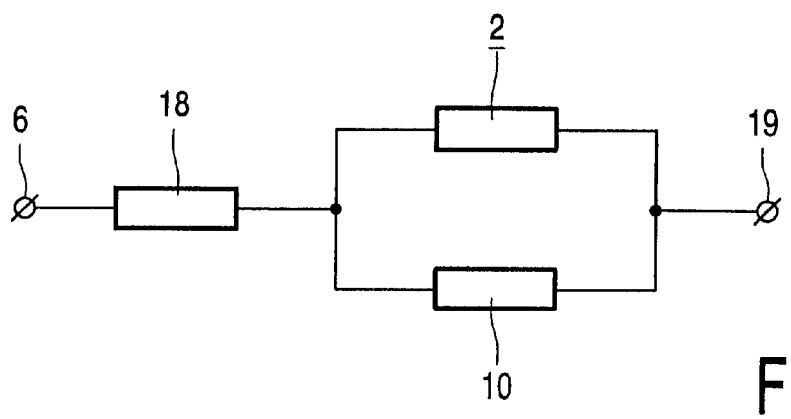
FIG. 4a shows an electrical circuit diagram of the total resistance, comprising the resistance of the first magnetic element, the shunt resistance and the trimmer resistance.

In the electrical circuit diagram shown in FIG. 4a, the total resistance between the first contact 6 and the first output contact 19 is represented.

Figure 4B:
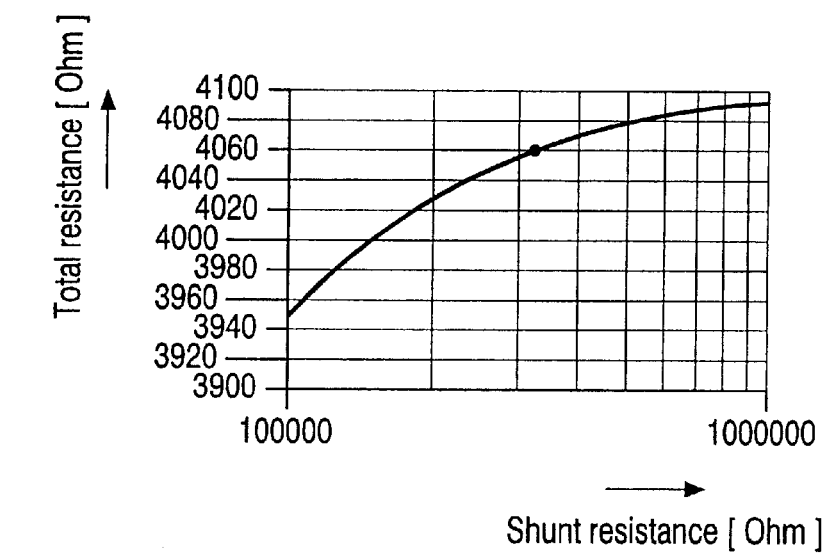
FIG. 4b shows the change of the resistance value and the temperature coefficient of the first magnetic element as a function of the shunt resistance.
Figure 4B:
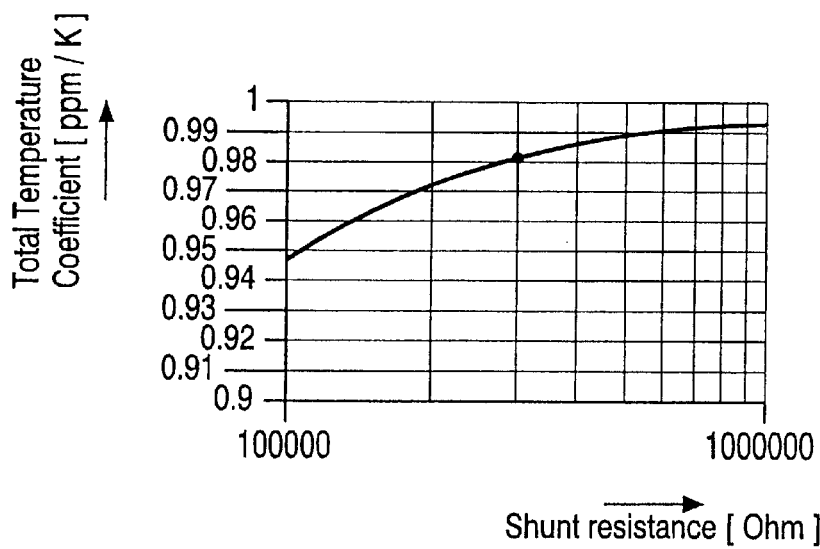

The shunt resistor 10 is electrically parallel-connected with the first magnetic element 2 in the first bridge portion 8. The resistance of the first magnetic element 2 is, for example, R=4100 Ohm, the temperature coefficient of the first magnetic element=1400 ppm/K and the temperature coefficient of the shunt resistor $\alpha$=−510 ppm/K. The trimmer resistance 18 $R_{trim}$ is 0 $\Omega$. FIG. 4b shows the effect of of the shunt resistance 10 on the total resistance and on the total temperature coefficient at T=20° C. A variation of the shunt resistance 10 in the range from 300 kOhm to 1 MOhm only leads to a small variation in the total resistance of 1% (41 Ohm), whereas the temperature coefficient changes by 1.8% at a value of the shunt resistance of 300 kOhm. This is sufficient to compensate for the offset voltage drift (1% change of the temperature coefficient means 6.6 $\mu$V/K offset voltage drift).

In this example, the shunt resistance 10 is approximately a factor of 80 higher than the resistance of the first magnetic element 2. If the magnetoresistance effect is approximately 6%, the reduction of the magnetoresistance effect, in this example, is only 0.07%. The 41 Ohm change in total resistance causes the output voltage of the bridge to change by an offset of 5 mV.

The shunt resistance 10 can be adjusted by switching on or off a number of resistors of an electric circuit by means of a laser. The circuit of resistors extends parallel to the first magnetic element 2.

Figure 4C:
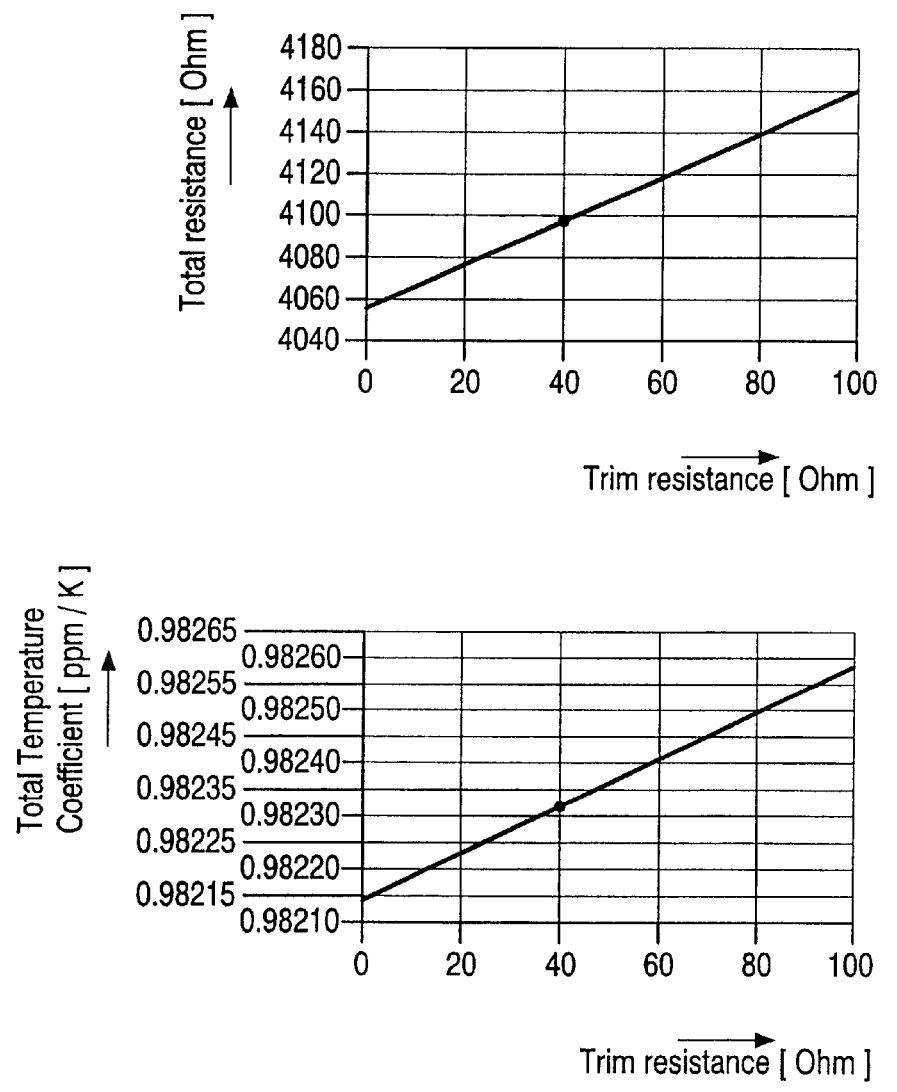
FIG. 4c shows how the change in resistance of the first magnetic element and the shunt resistor is compensated for by the trimmer resistor, as well as the effect on the total temperature coefficient.

The trimmer resistor 18 is used to compensate for the 5 mV offset voltage, the temperature coefficient hardly being influenced thereby. FIG. 4c shows that the total electric resistance of the first magnetic element 2 and the shunt resistor 10 is only 4060 Ohm. In order to increase the total resistance to the original value of R=4100 Ohm, the trimmer resistance 18 must have a value of 40 Ohm. This causes a change in temperature coefficient of only 0.017% (relative to the 1.8% change caused by the shunt resistance). This comparatively small change in the overall temperature coefficient does not have to be compensated.

In this manner, the offset voltage is reduced to zero and the drift in offset voltage is substantially reduced.

The sensor in accordance with the invention enables small magnetic fields of a few Oerstedts to be measured even more accurately.

What is claimed is:

1. A sensor for measuring a magnetic field, comprising a substrate, a first magnetic element, a second magnetic element, a third magnetic element and a fourth magnetic element on the substrate in a bridge configuration, a first bridge portion wherein the first element and the second element are arranged in series, and a second bridge portion wherein the third element and the fourth element are arranged in series being situated between a first contact and a second contact, wherein the first bridge portion includes an electric shunt resistor, which has a temperature coefficient and electrically connected in parallel with the first magnetic element.

2. A sensor as claimed in claim 1, wherein the first magnetic element comprises an electric resistor having a temperature coefficient that is of opposite sign to the temperature coefficient of the shunt resistor.

3. A sensor as claimed in claim 1, wherein an absolute value of the temperature coefficient of the shunt resistor is larger than the absolute value of the temperature coefficient of the electric resistor of the first magnetic element.

4. A sensor as claimed in claim 1, wherein the shunt resistor comprises one or more layers of a material.

5. A sensor as claimed in claim 1, wherein the shunt resistor has a resistance value that exceeds the resistance value of the first magnetic element.

6. A sensor as claimed in claim 1, wherein a second shunt resistor is arranged parallel to an element of the second bridge portion.

7. A sensor as claimed in claim 1, wherein each magnetic element comprises a number of paths of a magnetic material, which paths are mutually connected in series by electric conductors.

8. A sensor as claimed in claim 7, wherein a resistance of the electric conductors of each magnetic element is substantially equal.

9. A sensor as claimed in claim 7, wherein a material of the electric conductors has a temperature coefficient that corresponds to the temperature coefficient of the magnetic material of the first magnetic element.

10. A sensor as claimed in claim 1, wherein the first bridge portion comprises an electrical trimmer resistor which is connected in series to the first magnetic element and the shunt resistor.

11. A method of regulating a sensor for measuring a magnetic field, wherein a first magnetic element, a second magnetic element, a third magnetic element and a fourth magnetic element are situated on a substrate in a bridge configuration, a first bridge portion wherein the first element and the second element are arranged in series, and a second bridge portion wherein the third element and the fourth element are arranged in series being situated between a first contact and a second contact, and a first output contact being situated between the first element and the second element, and a second output contact being situated between the third element and the fourth element, a voltage being applied between the first contact and the second contact wherein in the absence of a magnetic field, an output voltage between the first output contact and the second output contact of the bridge is reduced by means of a shunt resistor which is electrically parallel-connected with the first magnetic element in the first bridge portion.

12. A method as claimed in claim 11, wherein the output voltage is reduced at a temperature above room temperature.

13. A method as claimed in claim 11, wherein the shunt resistance that is used can be adjusted.

14. A method as claimed in claim 13, wherein the shunt resistance is adjusted by trimming with a laser.

15. A method as claimed in claim 14, wherein, after adjusting the shunt resistance, the output voltage of the bridge is reduced at room temperature by means of an electrically adjustable trimmer resistor, which is connected in series with the first magnetic element.

* * * * *